US008259852B2

(12) United States Patent
Yu (10) Patent No.: US 8,259,852 B2
(45) Date of Patent: Sep. 4, 2012

(54) METHOD AND SYSTEM FOR SATELLITE COMMUNICATION

(75) Inventor: Tommy Yu, Orange, CA (US)

(73) Assignee: Broadcom Corporation, Irvine, CA (US)

( * ) Notice: Subject to any disclaimer, the term of this patent is extended or adjusted under 35 U.S.C. 154(b) by 1465 days.

(21) Appl. No.: 11/692,702

(22) Filed: Mar. 28, 2007

(65) Prior Publication Data

US 2008/0018802 A1 Jan. 24, 2008

Related U.S. Application Data

(60) Provisional application No. 60/831,888, filed on Jul. 19, 2006.

(51) Int. Cl.
*H03K 9/00* (2006.01)

(52) U.S. Cl. ........ 375/316; 375/356; 375/354; 375/355; 375/357; 375/362; 375/363; 375/365; 375/366; 375/368; 725/61; 725/147

(58) Field of Classification Search .................. 375/316, 375/354, 356; 725/61, 147
See application file for complete search history.

(56) References Cited

U.S. PATENT DOCUMENTS

| | | | |
|---|---|---|---|
| 5,787,133 A | 7/1998 | Marchetto et al. | |
| 5,852,630 A * | 12/1998 | Langberg et al. | 375/219 |
| 6,314,447 B1 * | 11/2001 | Lea et al. | 718/105 |
| 7,061,976 B1 * | 6/2006 | Petranovich | 375/233 |
| 7,187,903 B1 * | 3/2007 | Febvre et al. | 455/13.2 |
| 7,248,637 B2 * | 7/2007 | Hwang et al. | 375/262 |
| 7,313,174 B2 * | 12/2007 | Alard et al. | 375/149 |
| 7,583,801 B2 * | 9/2009 | Terekhova et al. | 380/201 |
| 2005/0099968 A1 * | 5/2005 | Yamano | 370/311 |
| 2006/0025079 A1 * | 2/2006 | Sutskover et al. | 455/67.11 |
| 2006/0085720 A1 * | 4/2006 | Tran et al. | 714/758 |
| 2007/0133727 A1 * | 6/2007 | Kim et al. | 375/367 |
| 2007/0201306 A1 * | 8/2007 | Wulf et al. | 366/205 |
| 2010/0157881 A1 * | 6/2010 | Santoru et al. | 370/317 |

FOREIGN PATENT DOCUMENTS

| | | |
|---|---|---|
| EP | 1 657 837 A | 5/2006 |
| WO | WO 95/08889 | 3/1995 |
| WO | WO 2005/011189 | 2/2005 |

OTHER PUBLICATIONS

ETSI TR 102 376 V1.1.1, Digtial Video Boardcasting (DVB) User guidelines for the second generation system for Broadcasting, Interactive services, News Gathering and other broadband satellite applications (DVB-S2), Feb. 2005.*
European Search Report corresponding to European Patent Application Serial No. 07008784.6-2223, mailed Oct. 27, 2008, 3 pages.
TW Office Action (Issued Mar. 28, 2012).

* cited by examiner

*Primary Examiner* — Siu Lee
(74) *Attorney, Agent, or Firm* — Thomas, Kayden, Horstemeyer & Risley, LLP (57) ABSTRACT

Certain aspects of a method and system for satellite communication are disclosed. Aspects of one method may include a receiver that handles digital video broadcasting. The receiver may be enabled to dynamically vary spacing between one or more pilots within at least one frame based on a determined symbol rate. The size of each of a plurality of received programs may be determined and the spacing between one or more pilots may be dynamically varied based on the determined size of each of the plurality of received programs.

21 Claims, 8 Drawing Sheets

METHOD AND SYSTEM FOR SATELLITE COMMUNICATION

CROSS-REFERENCE TO RELATED APPLICATIONS/INCORPORATION BY REFERENCE

This application makes reference to, claims priority to, and claims the benefit of U.S. Provisional Application Ser. No. 60/831,888, filed on Jul. 19, 2006.

This application makes reference to:
U.S. application Ser. No. 11/385,390, filed on Mar. 21, 2006; and
U.S. application Ser. No. 11/385,081, filed on Mar. 21, 2006.

Each of the above referenced applications is hereby incorporated herein by reference in its entirety.

FIELD OF THE INVENTION

Certain embodiments of the invention relate to communication systems. More specifically, certain embodiments of the invention relate to a method and system for satellite communication.

BACKGROUND OF THE INVENTION

Broadcasting and telecommunications have historically occupied separate fields. In the past, broadcasting was largely an "over-the-air" medium while wired media carried telecommunications. That distinction may no longer apply as both broadcasting and telecommunications may be delivered over either wired or wireless media. Present development may adapt broadcasting to mobility services. One limitation has been that broadcasting may often require high bit rate data transmission at rates higher than could be supported by existing mobile communications networks.

Terrestrial television and radio broadcast networks have made use of high power transmitters covering broad service areas, which enable one-way distribution of content to user equipment such as televisions and radios. By contrast, wireless telecommunications networks have made use of low power transmitters, which have covered relatively small areas known as "cells". Unlike broadcast networks, wireless networks may be adapted to provide two-way interactive services between users of user equipment such as telephones and computer equipment.

Standards for digital television terrestrial broadcasting (DTTB) have evolved around the world with different systems being adopted in different regions. The three leading DTTB systems are, the advanced standards technical committee (ATSC) system, the digital video broadcast terrestrial (DVB-T) system, and the integrated service digital broadcasting terrestrial (ISDB-T) system. The ATSC system has largely been adopted in North America, South America, Taiwan, and South Korea. This system adapts trellis coding and 8-level vestigial sideband (8-VSB) modulation. The DVB-T system has largely been adopted in Europe, the Middle East, Australia, as well as parts of Africa and parts of Asia. The DVB-T system adapts coded orthogonal frequency division multiplexing (COFDM). The ISDB-T system has been adopted in Japan and adapts bandwidth segmented transmission orthogonal frequency division multiplexing (BST-OFDM).

While 3G systems are evolving to provide integrated voice, multimedia, and data services to mobile user equipment, there may be compelling reasons for adapting DTTB systems for this purpose. One of the more notable reasons may be the high data rates that may be supported in DTTB systems. For example, DVB-T may support data rates of 15 Mbits/s in an 8 MHz channel in a wide area single frequency network (SFN). There are also significant challenges in deploying broadcast services to mobile user equipment. Because of form factor constraints, many handheld portable devices, for example, may require that PCB area be minimized and that services consume minimum power to extend battery life to a level that may be acceptable to users. Another consideration is the Doppler effect in moving user equipment, which may cause inter-symbol interference in received signals. Among the three major DTTB systems, ISDB-T was originally designed to support broadcast services to mobile user equipment. While DVB-T may not have been originally designed to support mobility broadcast services, a number of adaptations have been made to provide support for mobile broadcast capability. The adaptation of DVB-T to mobile broadcasting is commonly known as DVB handheld (DVB-H). The broadcasting frequencies for Europe are in UHF (bands IV/V) and in the US, the 1670-1675 MHz band that has been allocated for DVB-H operation. Additional spectrum is expected to be allocated in the L-band world-wide.

The DVB-S2 is a second generation standard for satellite broadband applications, developed by the digital video broadcasting (DVB) project. The DVB-S2 standard may be enabled to support quadrature phase shift keying (QPSK), 8PSK, 16 phase asymmetric phase shift keying (16APSK), and 32APSK modulation systems. The DVB-S2 standard may be enabled to transport single or multiple streams in a variety of formats, for example, MPEG-2 transport streams and each stream may be protected in a different manner.

Communication systems may employ coding to ensure reliable communication across noisy communication channels. These communication channels may exhibit a fixed capacity that may be expressed in terms of bits per symbol at a certain signal to noise ratio (SNR), defining a theoretical upper limit known as the Shannon limit. As a result, coding design has aimed to achieve rates approaching this Shannon limit. One such class of codes that approach the Shannon limit is low density parity check (LDPC) codes.

The LDPC encoding technique may be highly complex and its generator matrix may require storing a very large, non-sparse matrix. From an implementation perspective, a key challenge in LDPC code implementation may include achieving a connection network between several processing nodes in a decoder. Further, the computational load in the decoding process, specifically the check node operations may pose problems or challenges such as performance, complexity and storage requirements.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for satellite communication, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for satellite communication. Aspects of the method and system may comprise a receiver handling digital video broadcasting. The receiver may be enabled to dynamically vary spacing between one or more pilots within at least one frame based on a determined symbol rate. The size of each of a plurality of received programs may be determined and the spacing between one or more pilots may be dynamically varied based on the determined size of each of the plurality of received programs.

Figure 1A:
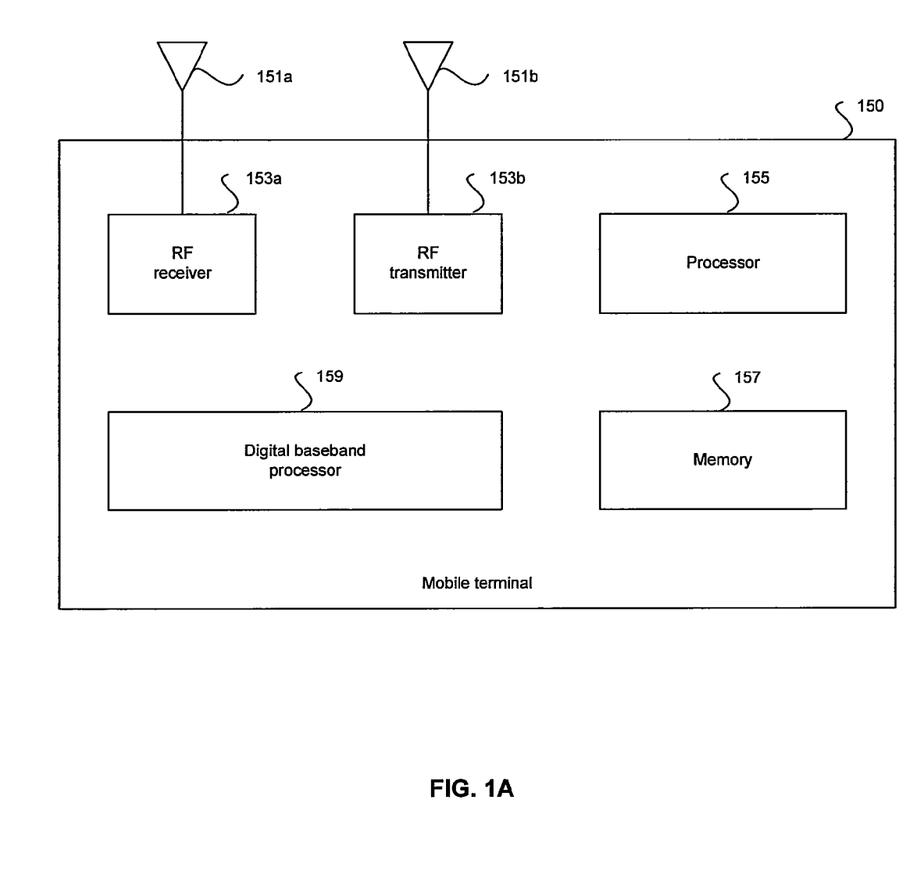
FIG. 1A is a block diagram illustrating an exemplary mobile terminal, in accordance with an embodiment of the invention.

FIG. 1A is a block diagram illustrating an exemplary mobile terminal, in accordance with an embodiment of the invention. Referring to FIG. 1A, there is shown a mobile terminal 150 that may comprise a RF receiver 153a, a RF transmitter 153b, a digital baseband processor 159, a processor 155, and a memory 157. A receive antenna 151a may be communicatively coupled to the RF receiver 153a. A transmit antenna 151b may be communicatively coupled to the RF transmitter 153b. U.S. application Ser. No. 11/385,390 filed on Mar. 21, 2006, provides a detailed description of a cellular network and/or digital video broadcast network in which a mobile terminal may communicate, and is hereby incorporated by reference in its entirety. For example, the mobile terminal 150 may communicate in the video broadcast network.

The RF receiver 153a may comprise suitable logic, circuitry, and/or code that may enable processing of received RF signals. The RF receiver 153a may enable receiving RF signals in a plurality of frequency bands. For example, the RF receiver 153a may enable receiving DVB-H transmission signals via the UHF band, from about 470 MHz to about 890 MHz, the 1670-1675 MHz band, and/or the L-band, from about 1400 MHz to about 1700 MHz, for example. The RF receiver 153a may enable receiving DVB-S2 transmission signals, for example. Moreover, the RF receiver 153a may enable receiving signals in cellular frequency bands, for example. Each frequency band supported by the RF receiver 153a may have a corresponding front-end circuit for handling low noise amplification and down conversion operations, for example. In this regard, the RF receiver 153a may be referred to as a multi-band receiver when it supports more than one frequency band. In another embodiment of the invention, the mobile terminal 150 may comprise more than one RF receiver 153a, wherein each of the RF receiver 153a may be a single-band or a multi-band receiver.

The RF receiver 153a may quadrature down convert the received RF signal to a baseband frequency signal that comprises an in-phase (I) component and a quadrature (Q) component. The RF receiver 153a may perform direct down conversion of the received RF signal to a baseband frequency signal, for example. In some instances, the RF receiver 153a may enable analog-to-digital conversion of the baseband signal components before transferring the components to the digital baseband processor 159. In other instances, the RF receiver 153a may transfer the baseband signal components in analog form.

The digital baseband processor 159 may comprise suitable logic, circuitry, and/or code that may enable processing and/or handling of baseband frequency signals. In this regard, the digital baseband processor 159 may process or handle signals received from the RF receiver 153a and/or signals to be transferred to the RF transmitter 153b, when the RF transmitter 153b is present, for transmission to the network. The digital baseband processor 159 may also provide control and/or feedback information to the RF receiver 153a and to the RF transmitter 153b based on information from the processed signals. The digital baseband processor 159 may communicate information and/or data from the processed signals to the processor 155 and/or to the memory 157. Moreover, the digital baseband processor 159 may receive information from the processor 155 and/or to the memory 157, which may be processed and transferred to the RF transmitter 153b for transmission to the network.

The RF transmitter 153b may comprise suitable logic, circuitry, and/or code that may enable processing of RF signals for transmission. The RF transmitter 153b may enable transmission of RF signals in a plurality of frequency bands. Moreover, the RF transmitter 153b may enable transmission of signals in cellular frequency bands, for example. Each frequency band supported by the RF transmitter 153b may have a corresponding front-end circuit for handling amplification and up conversion operations, for example. In this regard, the RF transmitter 153b may be referred to as a multi-band transmitter when it supports more than one frequency band. In another embodiment of the invention, the mobile terminal 150 may comprise more than one RF transmitter 153b, wherein each of the RF transmitter 153b may be a single-band or a multi-band transmitter.

The RF transmitter 153b may quadrature up convert the baseband frequency signal comprising I/Q components to an RF signal. The RF transmitter 153b may perform direct up conversion of the baseband frequency signal to a baseband frequency signal, for example. In some instances, the RF transmitter 153b may enable digital-to-analog conversion of the baseband signal components received from the digital baseband processor 159 before up conversion. In other instances, the RF transmitter 153*b* may receive baseband signal components in analog form.

The processor 155 may comprise suitable logic, circuitry, and/or code that may enable control and/or data processing operations for the mobile terminal 150. The processor 155 may be utilized to control at least a portion of the RF receiver 153*a*, the RF transmitter 153*b*, the digital baseband processor 159, and/or the memory 157. In this regard, the processor 155 may generate at least one signal for controlling operations within the mobile terminal 150. The processor 155 may also enable executing of applications that may be utilized by the mobile terminal 150. For example, the processor 155 may execute applications that may enable displaying and/or interacting with content received via DVB-H or DVB-S2 transmission signals in the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receiver 153*a* to enable receiving DVB-H or DVB-S2 transmission in the appropriate frequency band.

Figure 1B:
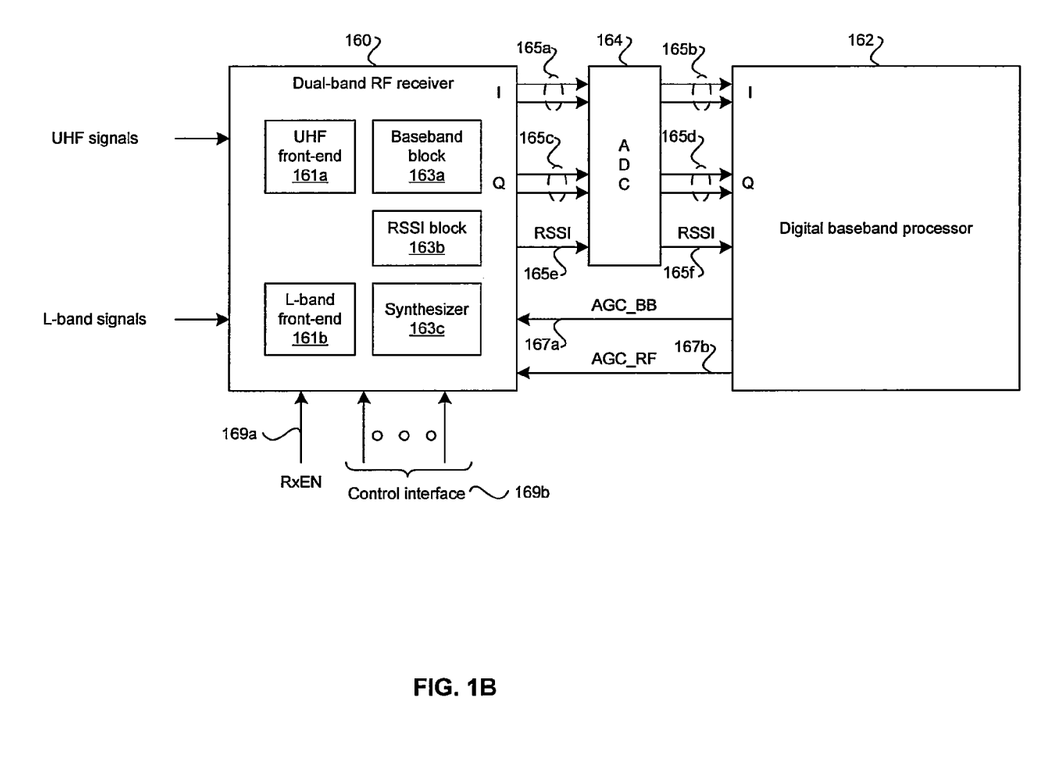
FIG. 1B is a block diagram illustrating exemplary communication between a dual-band RF receiver and a digital baseband processor in a mobile terminal, in accordance with an embodiment of the invention.

FIG. 1B is a block diagram illustrating exemplary communication between a dual-band RF receiver and a digital baseband processor in a mobile terminal, in accordance with an embodiment of the invention. Referring to FIG. 1B, there is shown a dual-band RF receiver 160, an analog-to-digital converter (ADC) 164, and a digital baseband processor 162. The dual-band RF receiver 160 may comprise a UHF front-end 161*a*, an L-band front-end 161*b*, a baseband block 163*a*, a received signal strength indicator (RSSI) block 163*b*, and a synthesizer 163*c*. The dual-band RF receiver 160, the analog-to-digital converter (ADC) 164, and/or the digital baseband processor 162 may be part of a mobile terminal, such as the mobile terminal 150 in FIG. 1A, for example.

The dual-band RF receiver 160 may comprise suitable logic, circuitry, and/or code that may enable handling of UHF and L-band signals. The dual-band RF receiver 160 may be enabled via an enable signal, such as the signal RxEN 169*a*, for example. In this regard, enabling the dual-band RF receiver 160 via the signal RxEN 169*a* by a 1:10 ON/OFF ratio may allow time slicing in DVB-H while reducing power consumption. At least a portion of the circuitry within the dual-band RF receiver 160 may be controlled via the control interface 169*b*. The control interface 169*b* may receive information from, for example, a processor, such as the processor 155 in FIG. 1A, or from the digital baseband processor 162. The control interface 169*b* may comprise more than one bit. For example, when implemented as a 2-bit interface, the control interface 169*b* may be an inter-integrated circuit (I2C) interface.

UHF front-end 161*a* may comprise suitable logic, circuitry, and/or code that may enable low noise amplification and direct down conversion of UHF signals. In this regard, the UHF front-end 161*a* may utilize an integrated low noise amplifier (LNA) and mixers, such as passive mixers, for example. The UHF front-end 161*a* may communicate the resulting baseband frequency signals to the baseband block 163*a* for further processing. U.S. application Ser. No. 11/385, 081 filed on Mar. 21, 2006, provides a detailed description of a digital television environment, and is hereby incorporated by reference in its entirety.

The L-band front-end 161*b* may comprise suitable logic, circuitry, and/or code that may enable low noise amplification and direct down conversion of L-band signals. In this regard, the L-band front-end 161*b* may utilize an integrated LNA and mixers, such as passive mixers, for example. The L-band front-end 161*b* may communicate the resulting baseband frequency signals to the baseband block 163*a* for further processing. The dual-band RF receiver 160 may enable one of the UHF front-end 161*a* and the L-band front-end 161*b* based on current communication conditions.

The synthesizer 163*c* may comprise suitable logic, circuitry, and/or code that may enable generating the appropriate local oscillator (LO) signal for performing direct down conversion in either the UHF front-end 161*a* or the L-band front-end 161*b*. Since the synthesizer 163*c* may enable fractional division of a source frequency when generating the LO signal, a large range of crystal oscillators may be utilized as a frequency source for the synthesizer 163*c*. This approach may enable the use of an existing crystal oscillator in a mobile terminal PCB, thus reducing the number of external components necessary to support the operations of the dual-band RF receiver 160, for example. The synthesizer 163*c* may generate a common LO signal for the UHF front-end 161*a* and for the L-band front-end 161*b*. In this regard, the UHF front-end 161*a* and the L-band front-end 161*b* may enable dividing the LO signal in order to generate the appropriate signal to perform down conversion from the UHF band and from the L-band respectively. In some instances, the synthesizer 163*c* may have at least one integrated voltage controlled oscillator (VCO) for generating the LO signal. In other instances, the VCO may be implemented outside the synthesizer 163*c*.

The baseband block 163*a* may comprise suitable logic, circuitry, and/or code that may enable processing of I/Q components generated from the direct down conversion operations in the UHF front-end 161*a* and the L-band front-end 161*b*. The baseband block 163*a* may enable amplification and/or filtering of the I/Q components in analog form. The baseband block 163*a* may communicate the processed I component, that is, signal 165*a*, and the processed Q component, that is, signal 165*c*, to the ADC 164 for digital conversion.

The RSSI block 163*b* may comprise suitable logic, circuitry, and/or code that may enable measuring the strength, that is, the RSSI value, of a received RF signal, whether UHF or L-band signal. The RSSI measurement may be performed, for example, after the received RF signal is amplified in either the UHF front-end 161*a* or the L-band front-end 161*b*. The RSSI block 163*b* may communicate the analog RSSI measurement or signal 165*e*, to the ADC 164 for digital conversion.

The ADC 164 may comprise suitable logic, circuitry, and/or code that may enable digital conversion of signals 165*a*, 165*c*, and/or 165*e* to signals 165*b*, 165*d*, and/or 165*f* respectively. In some instances, the ADC 164 may be integrated into the dual-band RF receiver 160 or into the digital baseband processor 162.

The digital baseband processor 162 may comprise suitable logic, circuitry, and/or code that may enable processing and/or handling of baseband frequency signals. In this regard, the digital baseband processor 162 may be the same or substantially similar to the digital baseband processor 159 described in FIG. 1A. The digital baseband processor 162 may enable generating at least one signal, such as the signals AGC_BB 167*a* and AGC_RF 167*b*, for adjusting the operations of the dual-band RF receiver 160. For example, the signal AGC_BB

167a may be utilized to adjust the gain provided by the baseband block 163a on the baseband frequency signals generated from either the UHF front-end 161a or the L-band front-end 161b. In another example, the signal AGC_RF 167b may be utilized to adjust the gain provided by an integrated LNA in either the UHF front-end 161a or the L-band front-end 161b. In another example, the digital baseband processor 162 may generate at least one control signal or control information communicated to the dual-band RF receiver 160 via the control interface 169b for adjusting operations within the dual-band RF receiver 160.

Figure 1C:
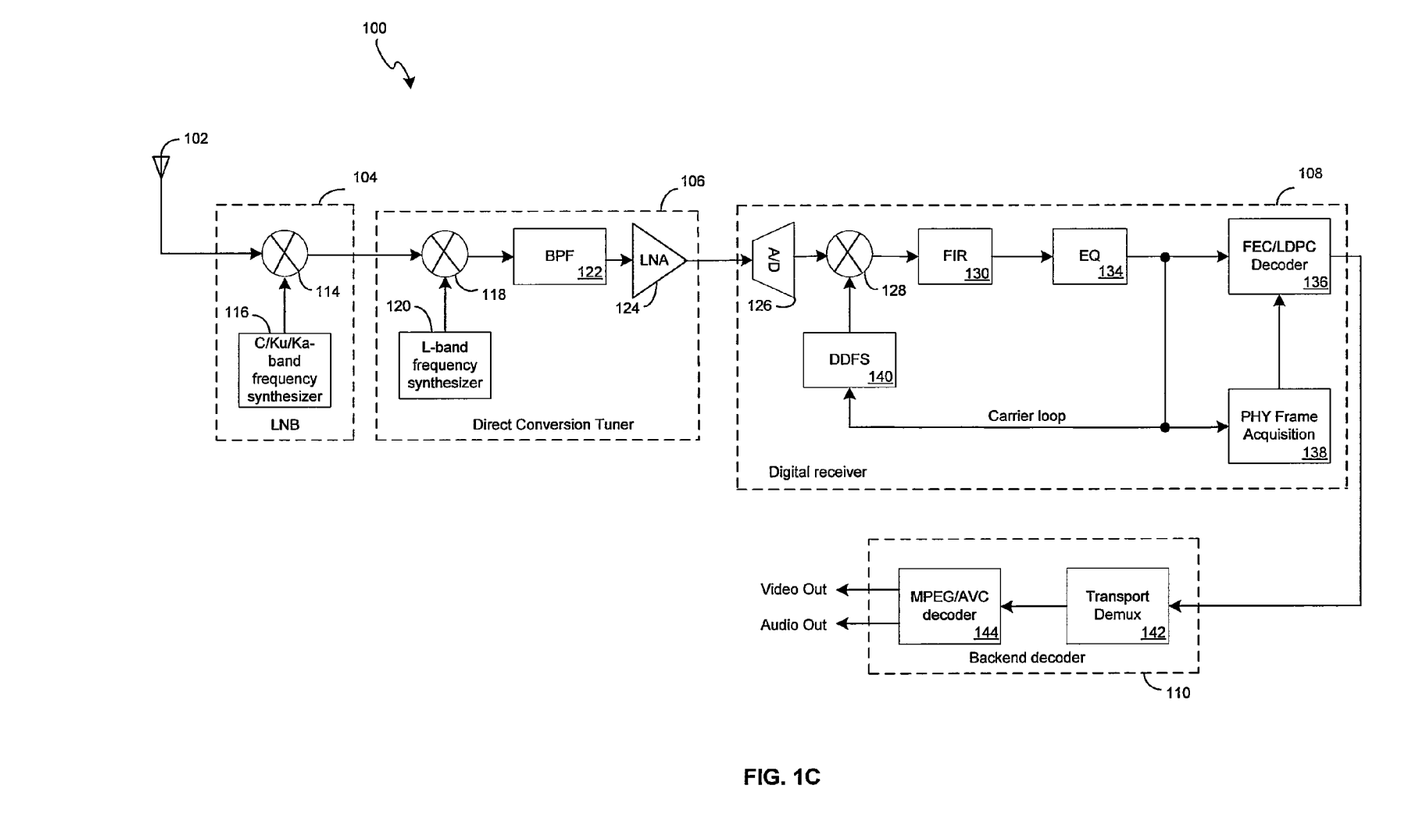
FIG. 1C is a block diagram of an exemplary satellite receiver, in accordance with an embodiment of the invention.

FIG. 1C is a block diagram of an exemplary satellite receiver, in accordance with an embodiment of the invention. Referring to FIG. 1C, there is shown a digital satellite receiver system 100. The digital satellite receiver system 100 may comprise an antenna 102, a low noise block (LNB) 104, a direct conversion tuner 106, a digital receiver 108, and a backend decoder 110. The LNB 104 may comprise a mixer 114, and a frequency synthesizer 116. The direct conversion tuner 106 may comprise a mixer 118, a frequency synthesizer 120, a band pass filter (BPF) 122, and a low noise amplifier (LNA) 124. The digital receiver 108 may comprise an analog to digital converter (ADC) 126, a mixer 128, a finite impulse response (FIR) filter 130, an equalizer 134, a decoder 136, a physical frame acquisition block 138, and a direct digital frequency synthesizer (DDFS) 140. The backend decoder 110 may comprise a transport demultiplexer 142, and a MPEG/AVC decoder 144.

The LNB 104 may comprise suitable logic, circuitry and/or code that may be enabled to receive a plurality of signals from a satellite, amplify the received signals, and downconvert the received signals to a lower frequency band. The antenna 102 may be enabled to receive the plurality of signals from one or more satellites. The mixer 114 may comprise suitable logic, circuitry and/or code that may be enabled to downconvert the received signals to a lower frequency band. The frequency synthesizer 116 may comprise suitable logic, circuitry and/or code that may be enabled to generate a plurality of signals, for example, a compromise (C) band, Kurtz-under (Ku) band or Kurtz-above (Ka) band signals to be mixed with the received plurality of signals. The LNB 104 may be enabled to downconvert a block of microwave frequencies as received from a satellite to a lower block range of frequencies in the cable to the digital receiver 108.

The mixer 118 may comprise suitable logic, circuitry and/or code that may be enabled to convert the received signals to a different frequency band, for example, L band. The frequency synthesizer 120 may comprise suitable logic, circuitry and/or code that may be enabled to generate a plurality of signals, for example, L band signals to be mixed with the received plurality of signals from the LNB 104. The band pass filter 122 may comprise suitable logic, circuitry and/or code that may be enabled to filter the received signals and allow a plurality of received signals within a particular frequency band. The low noise amplifier 124 may comprise suitable logic, circuitry, and/or code that may be enabled to receive an input signal from the BPF 122 and amplify the received signal with reduced additional noise.

The analog-to-digital converter (A/D) 126 may comprise suitable logic, circuitry and/or code that may be enabled to convert the received analog signal into a digital signal. The analog-to-digital converter 126 may generate a sampled digital representation of the filtered signal that may be communicated to the mixer 128 for processing. The mixer 128 may comprise suitable logic, circuitry and/or code that may be enabled to convert the received signals to a different frequency band.

The DDFS 140 may comprise suitable logic, circuitry and/or code that may be enabled to vary an output signal frequency over a large range of frequencies, based on a single fixed-frequency precision reference clock. The DDFS 140 may also be phase-tunable. The FIR filter 130 may comprise suitable logic, circuitry and/or code that may be enabled to filter the output signal generated from the mixer 128. The equalizer 134 may comprise suitable logic, circuitry and/or code that may be enabled to reduce frequency distortion.

The decoder 136 may comprise suitable logic, circuitry and/or code that may be enabled to provide forward error correction for the received signal. The decoder 136 may be enabled to utilize low density parity check (LDPC) codes to detect and correct any errors, which may occur in the received signal. The decoder 136 may comprise an outer Bose-Chaudhuri-Hocquenghem (BCH) decoder coupled with a LDPC inner decoder. The BCH decoder may be utilized to reduce the effects of an error floor. In accordance with an embodiment of the invention, the BCH decoder may be eliminated by utilizing a improved code design with a shorter frame size, for example, 43200 bits, which may reduce decoder latency.

The modulation mode and code rate of the digital receiver 108 may be varied from frame to frame in the physical layer of the DVB-S2 signal. The frames may be assigned to different transport streams. The QPSK modulation scheme may provide two bits per symbol, for example, while the 8PSK modulation scheme may provide three bits per symbol, for example. As a result, the 8PSK modulation scheme may enable the digital receiver 108 to carry about 50 percent more information within the same bandwidth than the QPSK modulation scheme, but may also require higher carrier to noise ratio for reception. The 8PSK modulation scheme may be utilized for broadcasting applications for high-power satellites with low noise figures.

The physical frame acquisition block 138 may comprise suitable logic, circuitry and/or code that may be enabled to add pilots to the received signal to facilitate signal recovery. The physical frame of the received DVB-S2 signal may comprise a header and a payload. The header may include synchronization information related to signalling. The digital receiver 108 may be enabled to utilize adaptive coding and modulation (ACM) to optimize point-to-point applications. In the ACM mode, the digital receiver 108 may be communicatively coupled to a transmitter via an uplink. The return path may provide an update of the signal to noise ratio (SNR) at the receive site available at the uplink station in order to modify coding and modulation to optimize the bit rate throughput.

The transport demultiplexer 142 may comprise suitable logic, circuitry and/or code that may be enabled to demultiplex the received decoded signals from the digital receiver 108. The MPEG/AVC decoder 144 may comprise suitable logic, circuitry and/or code that may be enabled to decode the received signals into an audio signal and a video signal.

Figure 2A:
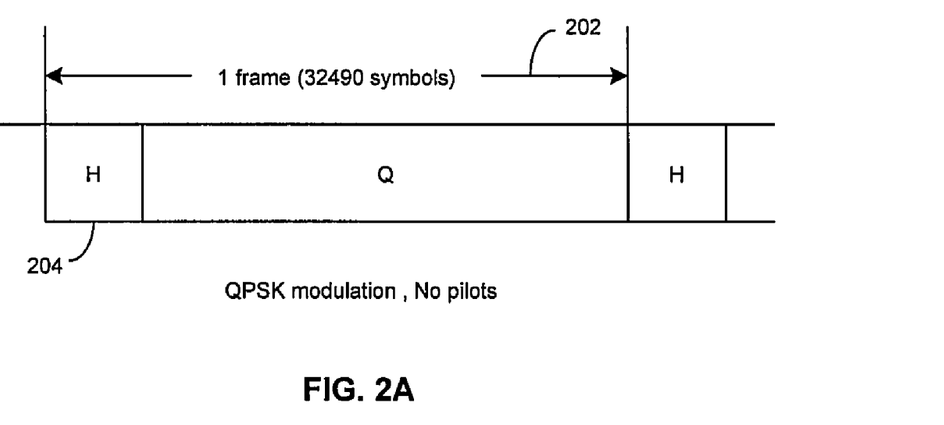
FIG. 2A is a diagram that illustrates an exemplary QPSK modulated frame structure without a pilot that may be utilized in connection with an embodiment of the invention.

FIG. 2A is a diagram that illustrates an exemplary QPSK modulated frame structure without pilots that may be utilized in connection with an embodiment of the invention. Referring to FIG. 2A, there is shown a frame 202 that may be QPSK modulated without a pilot. The frame 202 may be for example, a DVB-S2 frame or a DVB-H frame. The frame 202 may comprise 32490 symbols, for example. The frame 202 may comprise a header 204. The header 204 may comprise synchronization information related to signalling.

Figure 2B:
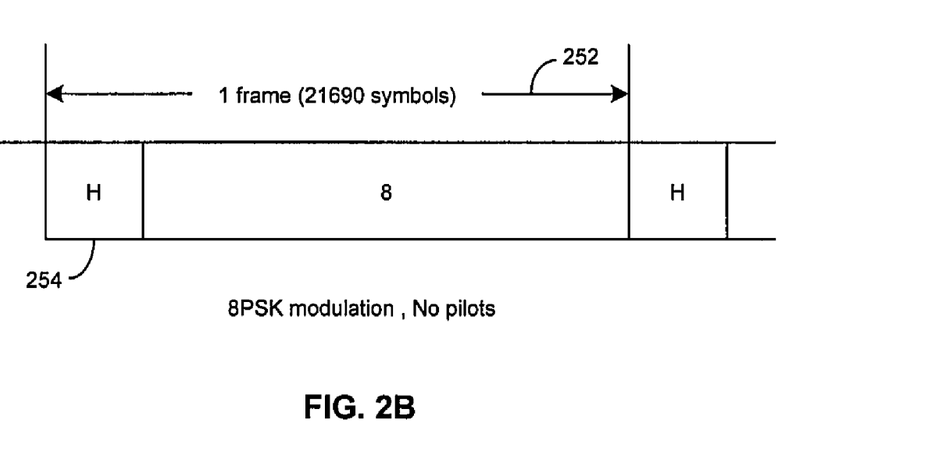
FIG. 2B is a diagram that illustrates an exemplary 8PSK modulated frame structure without a pilot that may be utilized in connection with an embodiment of the invention.

FIG. 2B is a diagram that illustrates an exemplary 8PSK modulated frame structure without pilots that may be utilized in connection with an embodiment of the invention. Referring to FIG. 2B, there is shown a frame 252 that may be 8PSK modulated without a pilot. The frame 252 may be for example, a DVB-S2 frame or a DVB-H frame. The frame 252 may comprise 21690 symbols, for example. The frame 252 may comprise a header 254. The header 254 may comprise synchronization information related to signalling.

Figure 3A:
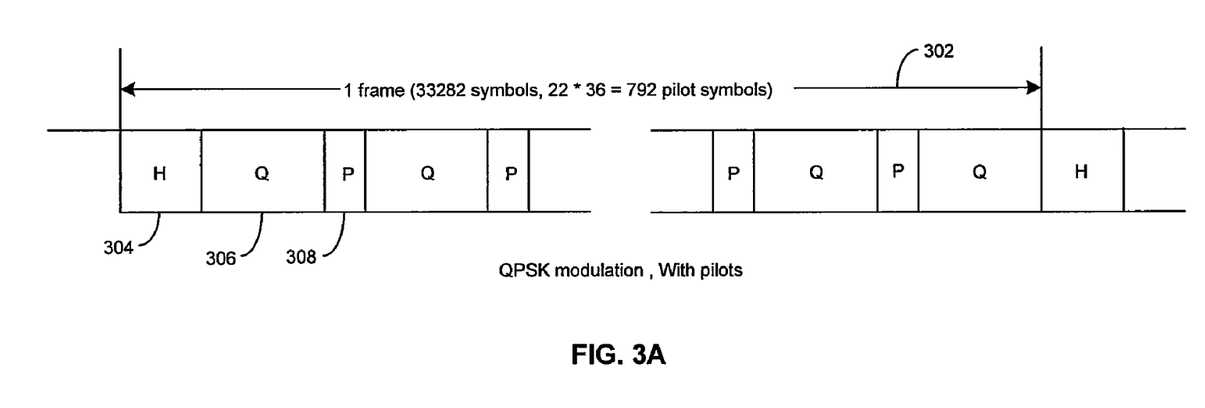
FIG. 3A is a diagram that illustrates an exemplary QPSK modulated frame structure with pilots that may be utilized in connection with an embodiment of the invention.

FIG. 3A is a diagram that illustrates an exemplary QPSK modulated frame structure with pilots that may be utilized in connection with an embodiment of the invention. Referring to FIG. 3A, there is shown a frame 302 that may be QPSK modulated with pilots. The frame 302 may be for example, a DVB-S2 frame or a DVB-H frame. The frame 302 may comprise 33282 symbols, for example. The frame 302 may comprise a header 304, and a plurality of pilots, for example, 308 and payload information between each of the plurality of pilots, for example, 306. The frame 302 may comprise 22 pilots, for example, and each pilot may be 36 symbols wide, for example. The frame 302 may comprise 792 pilot symbols, for example.

Figure 3B:
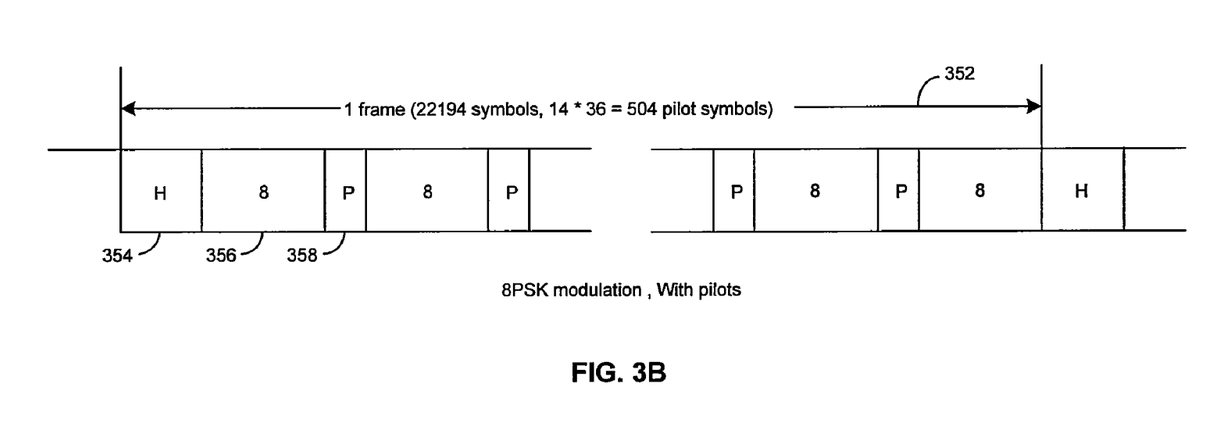
FIG. 3B is a diagram that illustrates an exemplary 8PSK modulated frame structure with pilots that may be utilized in connection with an embodiment of the invention.

FIG. 3B is a diagram that illustrates an exemplary 8PSK modulated frame structure with pilots that may be utilized in connection with an embodiment of the invention. Referring to FIG. 3B, there is shown a frame 302 that may be 8PSK modulated with pilots. The frame 352 may be for example, a DVB-S2 frame or a DVB-H frame. The frame 352 may comprise 22194 symbols, for example. The frame 352 may comprise a header 354, and a plurality of pilots, for example, 358 and payload information between each of the plurality of pilots, for example, 356. The frame 352 may comprise 14 pilots, for example, and each pilot may be 36 symbols wide, for example. The frame 352 may comprise 504 pilot symbols, for example.

Figure 4A:
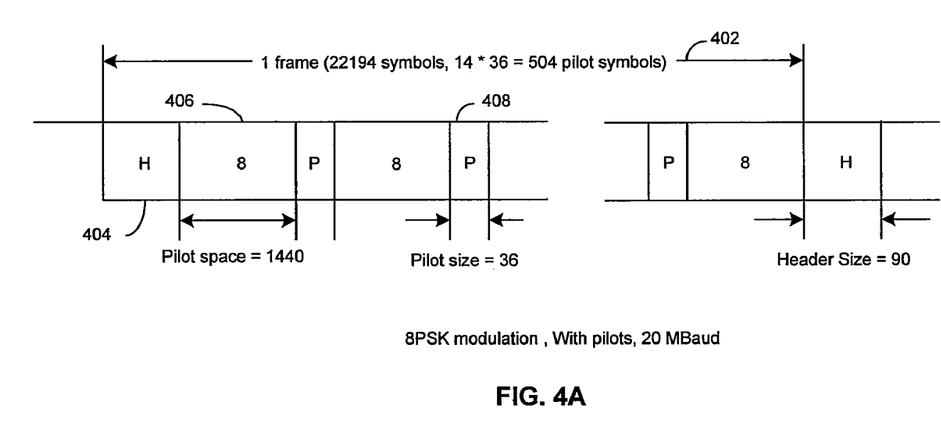
FIG. 4A is a diagram that illustrates an exemplary 8PSK modulated frame structure with pilots that may be utilized in connection with an embodiment of the invention.

FIG. 4A is a diagram that illustrates an exemplary 8PSK modulated frame structure with pilots that may be utilized in connection with an embodiment of the invention. Referring to FIG. 4A, there is shown a frame 402 that may be 8PSK modulated with pilots. The frame 402 may be for example, a DVB-S2 frame or a DVB-H frame. The frame 402 may comprise 22194 symbols at a 20 Mbaud symbol rate, for example. The frame 402 may comprise a header 404, and a plurality of pilots, for example, 408 and payload information between each of the plurality of pilots, for example, 406. The frame 402 may comprise 14 pilots, for example, and each pilot may be 36 symbols wide, for example. The frame 402 may comprise 504 pilot symbols, for example. The header 404 may be 90 symbols wide, for example.

Figure 4B:
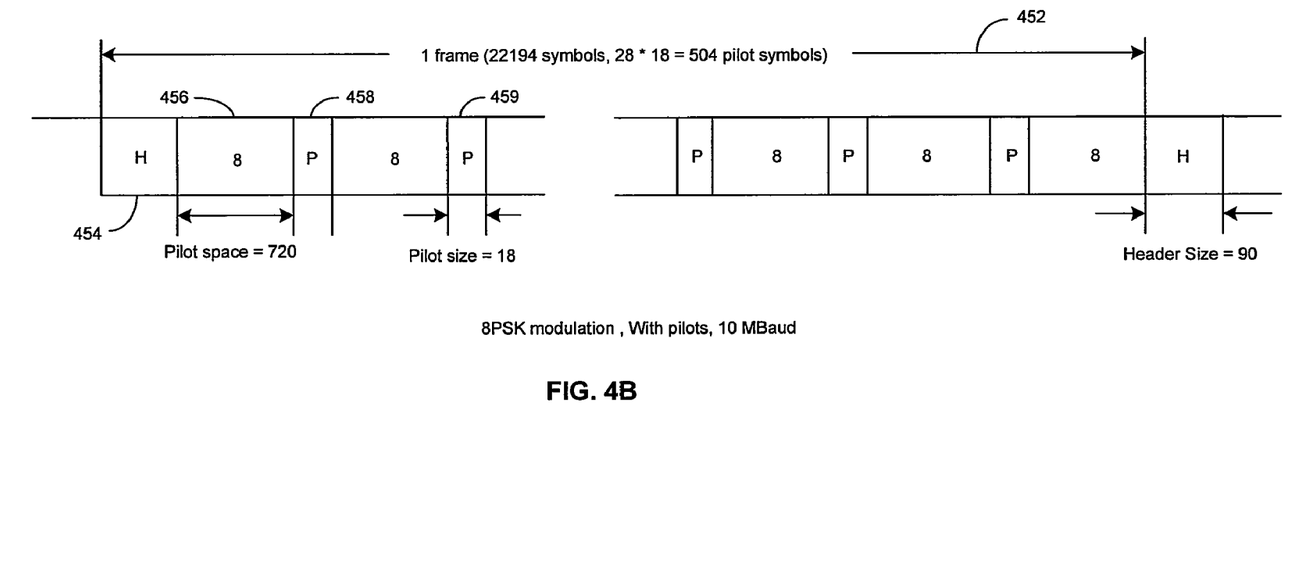
FIG. 4B is a diagram that illustrates an exemplary 8PSK modulated frame structure with variable pilots, in accordance with an embodiment of the invention.

FIG. 4B is a diagram that illustrates an exemplary 8PSK modulated frame structure with variable pilots, in accordance with an embodiment of the invention. Referring to FIG. 4B, there is shown a frame 452 that may be 8PSK modulated with pilots. The frame 452 may be for example, a DVB-S2 frame or a DVB-H frame. The frame 452 may comprise 22194 symbols at a 10 Mbaud symbol rate, for example. The frame 452 may comprise a header 454, and a plurality of pilots, for example, 458, 459, and spacing between each of the plurality of pilots, for example, 456. The digital receiver 108 may be configured to handle dynamically varying of spacing between one or more pilots within at least one frame based on a determined symbol rate. The digital receiver 108 may process pilots with variable size based on the determined symbol rate. For example, the frame 452 may comprise 28 pilots, for example, and each pilot may be 18 symbols wide, for example. The frame 452 may comprise 504 pilot symbols, for example. The header 454 may be 90 symbols wide, for example.

Figure 5:
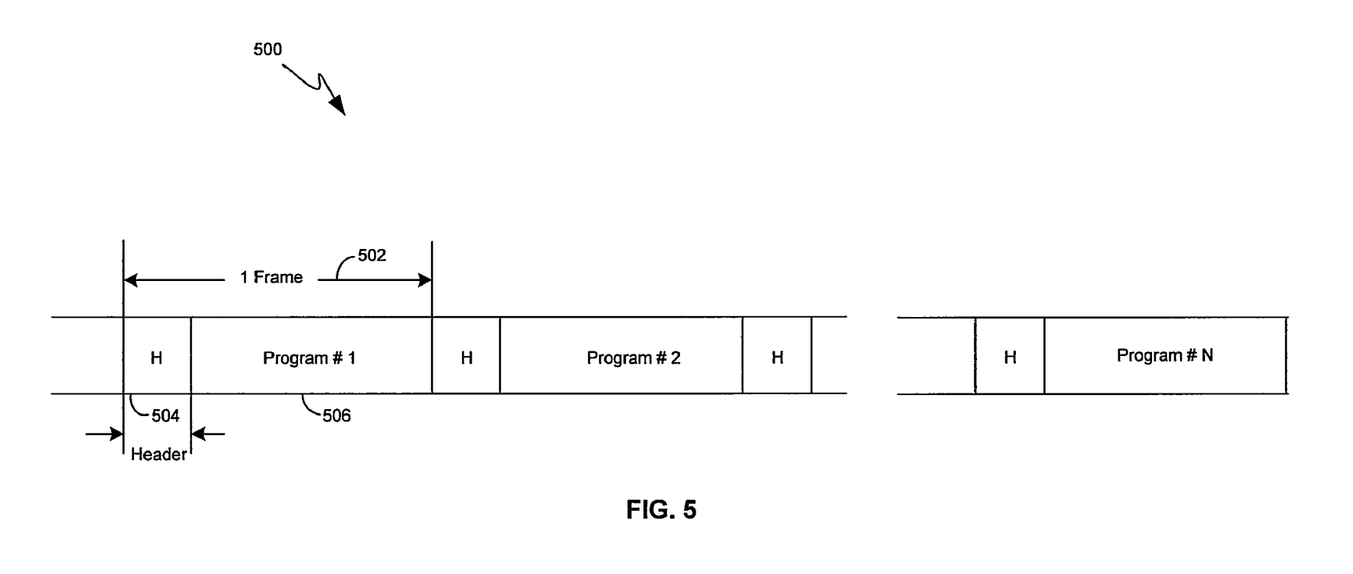
FIG. 5 is a diagram that illustrates an exemplary frame structure for supporting mobile satellite video reception, in accordance with an embodiment of the invention.

FIG. 5 is a diagram that illustrates an exemplary frame structure for supporting mobile satellite video reception, in accordance with an embodiment of the invention. Referring to FIG. 5, there is shown a received packet stream 500. The packet stream 500 may comprise a plurality of frames, for example, frame 1 502. The frame 1 502 may comprise a header 504 and a payload 506. The received packet stream 500 may be for example, a DVB-S2 packet stream or a DVB-H packet stream. The packet stream 500 may comprise a plurality of programs, for example, program #1 ... program #N. The digital receiver 108 may be enabled to determining a size of each of the plurality of received programs. The digital receiver 108 may be enabled to dynamically vary spacing between one or more pilots based on the determined size of each of the plurality of received programs. The spacing between the pilots may be varied to accommodate a whole program, for example, program #1 within a frame, for example, frame 1 502. The digital receiver 108 may be switched ON based on receiving at least one selected program among the plurality of received programs. The digital receiver 108 may be enabled to save power by switching ON during the duration of the received frame comprising the selected program. For example, the digital receiver 108 may be switched ON for the duration of frame 1 502, which comprises the selected program, program #1.

Figure 6:
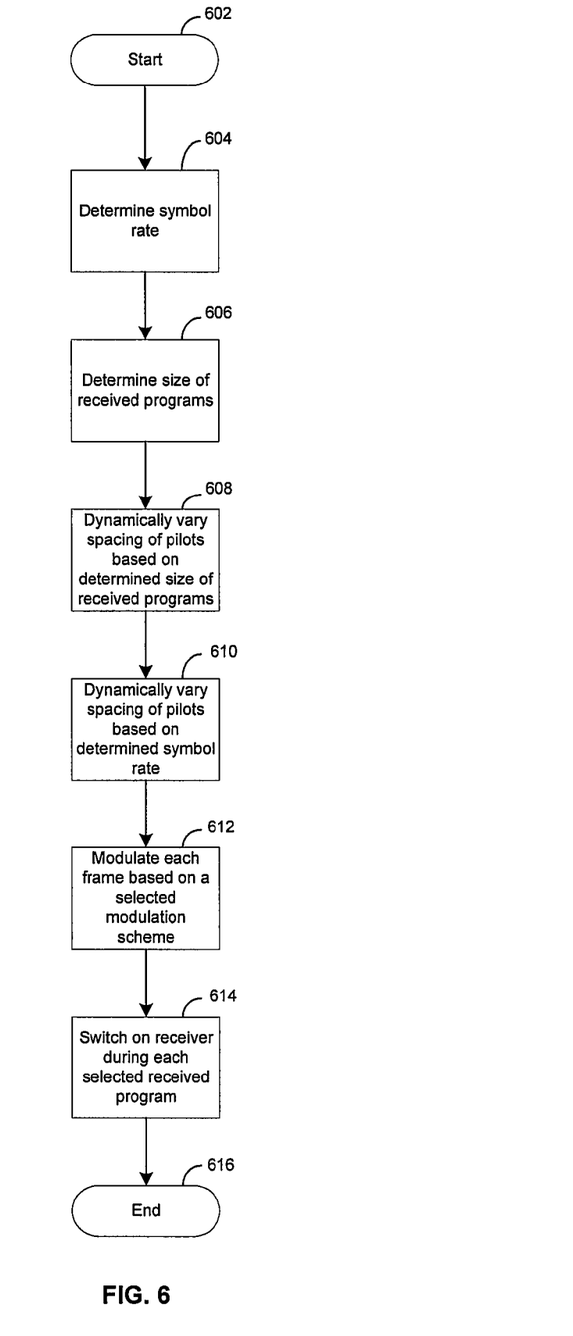
FIG. 6 is a flowchart illustrating exemplary steps for satellite communication, in accordance with an embodiment of the invention.

FIG. 6 is a flowchart illustrating exemplary steps for satellite communication, in accordance with an embodiment of the invention. Referring to FIG. 6, exemplary steps may begin at step 602. In step 604, the digital receiver 108 may be enabled to determine a symbol rate of the received frames. In step 606, the digital receiver 108 may be enabled to determine a size of each of the received programs. In step 608, the digital receiver 108 may be enabled to dynamically vary spacing, for example, 456 between one or more pilots, for example, between pilot 458 and pilot 459 within at least one frame 452 based on the determined size of each of the plurality of received programs, for example, program #1. In step 610, the digital receiver 108 may be enabled to dynamically vary spacing, for example, 456 between one or more pilots, for example, between pilot 458 and pilot 459 within at least one frame 452 based on the determined symbol rate, for example, 10 Mbaud. The digital receiver 108 may be enabled to dynamically vary a size of one or more pilots, for example, 458 based on the determined symbol rate. In step 612, the digital receiver 108 may be enabled to modulate each frame, for example, frame 452 using one of: a quadrature phase shift keying (QPSK), a 8-phase shift keying (8PSK), a 16-phase asymmetric phase shift keying (16APSK), and a 32-phase asymmetric phase shift keying (32APSK) modulation scheme. In step 614, the digital receiver 108 may be switched ON based on receiving at least one selected program among the plurality of received programs. The digital receiver 108 may be enabled to save power by switching ON during the duration of the received frame comprising the selected program. For example, the digital receiver 108 may be switched ON for the duration of frame 1 502, which comprises the selected program, program #1. Control the passes to end step 616.

In accordance with an embodiment of the invention, a method and system for satellite communication may include a digital receiver 108 handling digital video broadcasting. The digital receiver 108 may be enabled to dynamically vary spacing, for example, 456 between one or more pilots, for example, between pilot 458 and pilot 459 within at least one frame 452 based on a determined symbol rate, for example, 10 Mbaud. The digital receiver 108 may be enabled to determining a size of each of the plurality of received programs. The digital receiver 108 may be enabled to dynamically vary spacing, for example, 456 between one or more pilots, for example, 458 and 459 based on the determined size of each of the plurality of received programs, for example, program #1. The digital receiver 108 may be switched ON based on receiving at least one selected program among the plurality of received programs. The digital receiver 108 may be enabled to save power by switching ON during the duration of the received frame comprising the selected program. For example, the digital receiver 108 may be switched ON for the duration of frame 1 502, which comprises the selected program, program #1.

The digital receiver 108 may be enabled to dynamically vary a size of one or more pilots, for example, 458 based on the determined symbol rate. The digital receiver 108 may be enabled to modulate each frame, for example, frame 452 using one of: a quadrature phase shift keying (QPSK), a 8-phase shift keying (8PSK), a 16-phase asymmetric phase shift keying (16APSK), and a 32-phase asymmetric phase shift keying (32APSK) modulation scheme. The digital receiver 108 may be enabled to handle digital video broadcasting comprising a DVB-S2 standard and a DVB-H standard.

Another embodiment of the invention may provide a machine-readable storage, having stored thereon, a computer program having at least one code section executable by a machine, thereby causing the machine to perform the steps as described above for satellite communication.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
   in a receiver:
   determining a symbol rate of a received digital video broadcasting frame; and
   dynamically varying spacing between two or more pilots within said received digital video broadcasting frame based on said determined symbol rate.

2. The method according to claim 1, comprising determining a size of each of a plurality of received digital video broadcasting programs.

3. The method according to claim 2, comprising dynamically varying spacing between said two or more pilots based on said determined size of each of said plurality of received digital video broadcasting programs.

4. The method according to claim 2, comprising switching said receiver based on receiving at least one selected digital video broadcasting program among said plurality of received digital video broadcasting programs.

5. The method according to claim 1, comprising dynamically varying a size of said two or more pilots based on said determined symbol rate.

6. The method according to claim 1, comprising modulating said received digital video broadcasting frame using one of: a quadrature phase shift keying (QPSK), a 8-phase shift keying (8PSK), a 16-phase asymmetric phase shift keying (16APSK), and a 32-phase asymmetric phase shift keying (32APSK) modulation scheme.

7. The method according to claim 1, wherein said digital video broadcasting comprises one of: a DVB-S2 standard and a DVB-H standard.

8. A system for processing signals, the system comprising:
   one or more circuits for use in a receiver, said one or more circuits being operable to determine a symbol rate of a received digital video broadcasting frame; and
   said one or more circuits are operable to dynamically vary spacing between two or more pilots within said received digital video broadcasting frame based on said determined symbol rate.

9. The system according to claim 8, wherein said one or more circuits are operable to determine a size of each of a plurality of received digital video broadcasting programs.

10. The system according to claim 9, wherein said one or more circuits are operable to dynamically vary spacing between said two or more pilots based on said determined size of each of said plurality of received digital video broadcasting programs.

11. The system according to claim 9, wherein said one or more circuits are operable to switch said receiver based on receiving at least one selected digital video broadcasting program among said plurality of received digital video broadcasting programs.

12. The system according to claim 8, wherein said one or more circuits are operable to dynamically vary a size of said two or more pilots based on said determined symbol rate.

13. The system according to claim 8, wherein said one or more circuits are operable to modulate said received digital video broadcasting frame using one of: a quadrature phase shift keying (QPSK), a 8-phase shift keying (8PSK), a 16-phase asymmetric phase shift keying (16APSK), and a 32-phase asymmetric phase shift keying (32APSK) modulation scheme.

14. The system according to claim 8, wherein said digital video broadcasting comprises one of: a DVB-S2 standard and a DVB-H standard.

15. A non-transitory machine-readable storage having stored thereon, a computer program having at least one code section for processing signals, the at least one code section being executable by a machine for causing the machine to perform steps comprising:
   in a receiver:

determining a symbol rate of a received digital video broadcasting frame; and dynamically varying spacing between two or more pilots within said received digital video broadcasting frame based on said determined symbol rate.

16. The non-transitory machine-readable storage according to claim 15, wherein said at least one code section comprises code for determining a size of each of a plurality of received digital video broadcasting programs.

17. The non-transitory machine-readable storage according to claim 16, wherein said at least one code section comprises code for dynamically varying spacing between said two or more pilots based on said determined size of each of said plurality of received digital video broadcasting programs.

18. The non-transitory machine-readable storage according to claim 16, wherein said at least one code section comprises code for switching said receiver based on receiving at least one selected digital video broadcasting program among said plurality of received digital video broadcasting programs.

19. The non-transitory machine-readable storage according to claim 15, wherein said at least one code section comprises code for dynamically varying a size of said two or more pilots based on said determined symbol rate.

20. The non-transitory machine-readable storage according to claim 15, wherein said at least one code section comprises code for modulating said received digital video broadcasting frame using one of: a quadrature phase shift keying (QPSK), a 8-phase shift keying (8PSK), a 16-phase asymmetric phase shift keying (16APSK), and a 32-phase asymmetric phase shift keying (32APSK) modulation scheme.

21. The non-transitory machine-readable storage according to claim 15, wherein said digital video broadcasting comprises one of: a DVB-S2 standard and a DVB-H standard.

* * * * *